United States Patent
Sugiyama et al.

(10) Patent No.: US 9,040,420 B2
(45) Date of Patent: May 26, 2015

(54) MANUFACTURING METHOD OF SEMICONDUCTOR DEVICE INCLUDING PEELING LAYERS FROM SUBSTRATES BY ETCHING

(75) Inventors: Eiji Sugiyama, Kanagawa (JP); Yoshitaka Dozen, Kanagawa (JP); Yumiko Fukumoto, Kanagawa (JP); Hideaki Kuwabara, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 1857 days.

(21) Appl. No.: 11/276,349

(22) Filed: Feb. 24, 2006

(65) Prior Publication Data
US 2006/0199382 A1 Sep. 7, 2006

(30) Foreign Application Priority Data
Mar. 1, 2005 (JP) ................... 2005-056308

(51) Int. Cl.
*H01L 21/44* (2006.01)
*H01L 21/78* (2006.01)
(Continued)

(52) U.S. Cl.
CPC ....... *H01L 21/7806* (2013.01); *H01L 21/67132* (2013.01); *H01L 27/1214* (2013.01); *H01L 27/1266* (2013.01)

(58) Field of Classification Search
CPC . H01L 27/1214; H01L 27/1266; H01L 27/13; H01L 21/7806; H01L 2221/68386; H01L 21/67132

USPC .................. 438/458, 14, 670, 674, 149, 706; 216/13, 20
See application file for complete search history.

(56) References Cited

U.S. PATENT DOCUMENTS

| 5,629,132 | A | * | 5/1997 | Suzuki et al. ................. 430/258 |
| 5,757,456 | A |   | 5/1998 | Yamazaki et al. |
| 5,821,138 | A |   | 10/1998 | Yamazaki et al. |

(Continued)

FOREIGN PATENT DOCUMENTS

| EP | 0 867 917 A2 | 9/1998 |
| EP | 1 134 790 A2 | 9/2001 |

(Continued)

OTHER PUBLICATIONS

Japan 08-288522—English Abstract: Dialog(R)File 347:Japio (2006); Accession No. 05333022 and family to U.S. Patent No. 5,821,138 (Desig. ID "AH"), U.S. Patent No. 6,376,333 (Desig. ID "AK"), U.S. Patent Application Publication No. 2005/0162421 (Desig. ID "AF"), and U.S. Patent Application Publication No. 2005/0162578 (Desig. ID "AE").

(Continued)

*Primary Examiner* — Duy T Nguyen
(74) *Attorney, Agent, or Firm* — Fish & Richardson P.C.

(57) ABSTRACT

The present invention has an object to perform a peeling treatment in a short time. Peeling is performed while a peeling layer is exposed to an atmosphere of an etching gas. Alternatively, peeling is performed while an etching gas for a peeling layer is blown to the peeling layer in an atmosphere of an etching gas. Specifically, an etching gas is blown to a part to be peeled while a layer to be peeled is torn off from a substrate. Alternatively, peeling is performed in an etchant for a peeling layer while supplying an etchant to the peeling layer.

28 Claims, 7 Drawing Sheets

(51) Int. Cl.
*H01L 27/12* (2006.01)
*H01L 21/67* (2006.01)

(56) References Cited

U.S. PATENT DOCUMENTS

| | | | |
|---|---|---|---|
| 5,834,327 A | 11/1998 | Yamazaki et al. | |
| 6,118,502 A | 9/2000 | Yamazaki et al. | |
| 6,376,333 B1 | 4/2002 | Yamazaki et al. | |
| 6,382,292 B1* | 5/2002 | Ohmi et al. | 156/584 |
| 6,475,323 B1 | 11/2002 | Ohmi et al. | |
| 6,572,780 B2* | 6/2003 | McCormack et al. | 216/13 |
| 6,746,559 B2 | 6/2004 | Ohmi et al. | |
| 7,091,070 B2 | 8/2006 | Imai et al. | |
| 7,157,352 B2 | 1/2007 | Yamanaka | |
| 7,271,076 B2* | 9/2007 | Yamazaki et al. | 438/458 |
| 7,276,429 B2 | 10/2007 | Yamanaka | |
| 7,521,335 B2 | 4/2009 | Yamanaka | |
| 7,732,262 B2 | 6/2010 | Imai et al. | |
| 2001/0013505 A1* | 8/2001 | Sasaki | 216/74 |
| 2002/0088558 A1 | 7/2002 | Ohmi et al. | |
| 2002/0117256 A1* | 8/2002 | McCormack et al. | 156/289 |
| 2003/0007341 A1* | 1/2003 | Shimamura et al. | 361/816 |
| 2003/0022403 A1* | 1/2003 | Shimoda et al. | 438/14 |
| 2003/0032210 A1* | 2/2003 | Takayama et al. | 438/30 |
| 2003/0047280 A1* | 3/2003 | Takayama et al. | 156/344 |
| 2003/0071953 A1 | 4/2003 | Yamazaki et al. | |
| 2003/0082889 A1* | 5/2003 | Maruyama et al. | 438/455 |
| 2003/0102082 A1* | 6/2003 | Yanagita et al. | 156/344 |
| 2003/0203547 A1* | 10/2003 | Sakaguchi et al. | 438/151 |
| 2004/0171233 A1 | 9/2004 | Ohmi et al. | |
| 2004/0259331 A1* | 12/2004 | Ogihara et al. | 438/462 |
| 2005/0037605 A1* | 2/2005 | Kim et al. | 438/622 |
| 2005/0070038 A1 | 3/2005 | Yamazaki et al. | |
| 2005/0074954 A1* | 4/2005 | Yamanaka | 438/458 |
| 2005/0162421 A1 | 7/2005 | Yamazaki et al. | |
| 2005/0162578 A1 | 7/2005 | Yamazaki et al. | |
| 2005/0257811 A1* | 11/2005 | Axtell et al. | 134/34 |

FOREIGN PATENT DOCUMENTS

| | | |
|---|---|---|
| EP | 1 453 086 A2 | 9/2004 |
| JP | 08-250745 | 9/1996 |
| JP | 08-250745 A | 9/1996 |
| JP | 08-288522 | 11/1996 |
| JP | 11-045840 A | 2/1999 |
| JP | 2001-331120 | 11/2001 |
| JP | 2001-331120 A | 11/2001 |
| JP | 2003-163338 | 6/2003 |
| JP | 2003-174153 | 6/2003 |
| JP | 2004-134672 A | 4/2004 |
| JP | 2004-171004 | 6/2004 |
| JP | 2004-179649 A | 6/2004 |
| JP | 2004-282063 A | 10/2004 |
| TW | 2004-14485 A | 8/2004 |

OTHER PUBLICATIONS

Japan 08-250745—English Abstract: Dialog(R)File 347:Japio (2006); Accession No. 05295245 and family to U.S. Patent No. 5,757,456 (Desig. ID "AG"), U.S. Patent No. 6,118,502 (Desig. ID "AJ"), U.S. Patent Application Publication No. 2003/0071953 (Desig. ID "AC"), and U.S. Patent Application Publication No. 2005/0070038 (Desig. ID "AD").

Japan 2003-174153—English Abstract: Dialog(R)File 347:Japio (2006); Accession No. 07680288 and family to U.S. Patent Application Publication No. 2003/0032210 (Desig. ID "AA").

Japan 2003-163338—English Abstract: Dialog(R)File 347:Japio (2006); Accession No. 07669478 and family to U.S. Patent Application Publication No. 2003/0047280 (Desig. ID "AB").

Japan 2004-171004—English Abstract: Dialog(R)File 347:Japio (2006); Accession No. 08058245.

Japan 2001-331120—English Abstract: Dialog(R)File 347:Japio (2006); Accession No. 07103463.

Taiwanese Office Action (Taiwan Application No. 95106465) mailed Jul. 11, 2012 with English language translation.

* cited by examiner

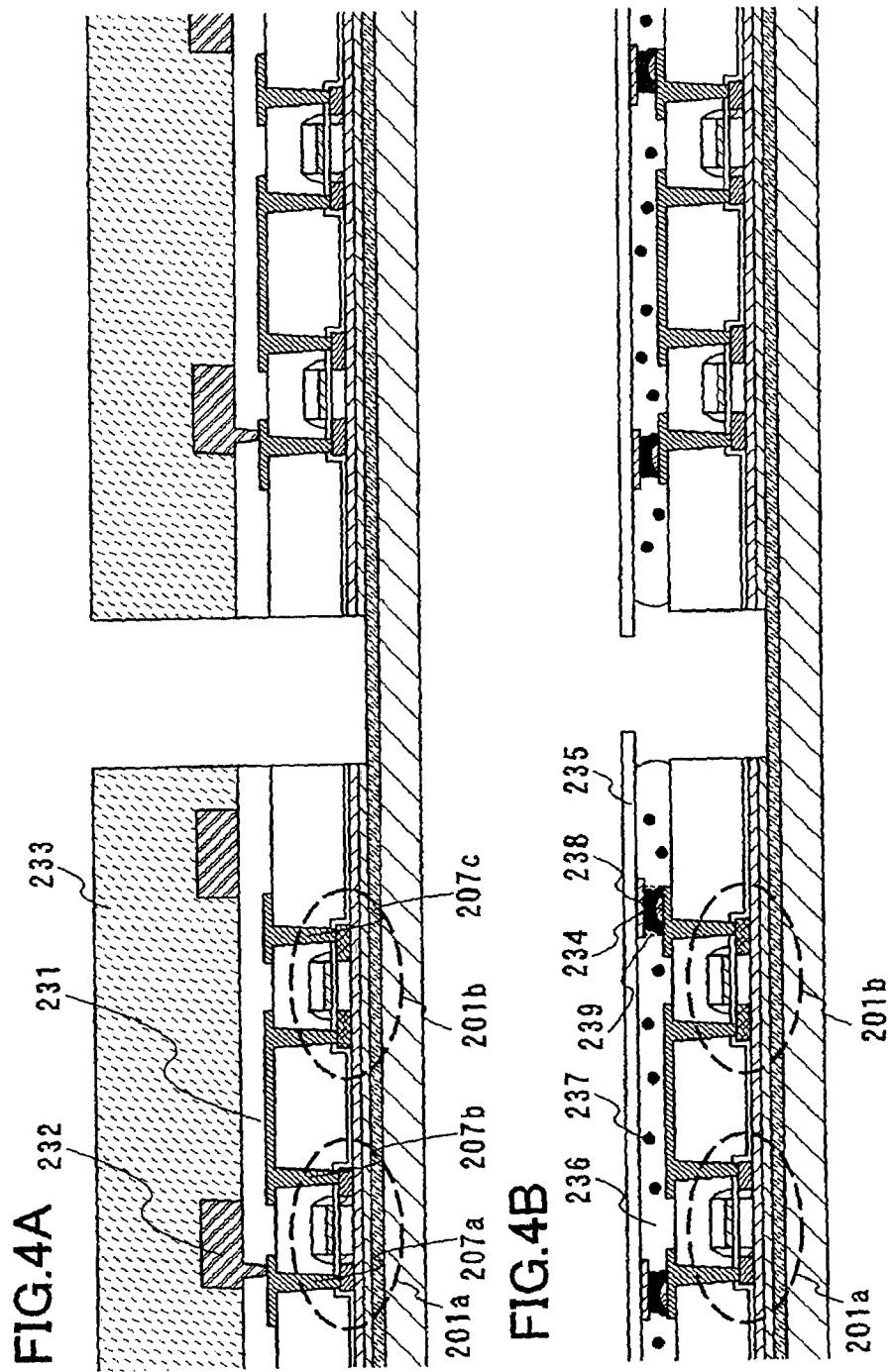

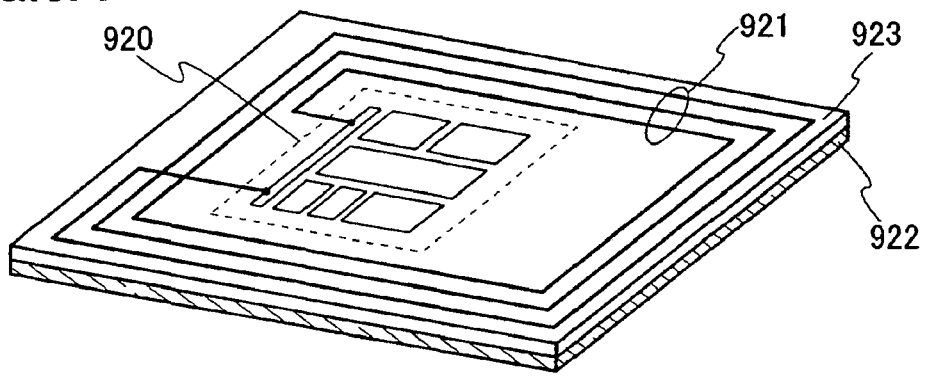
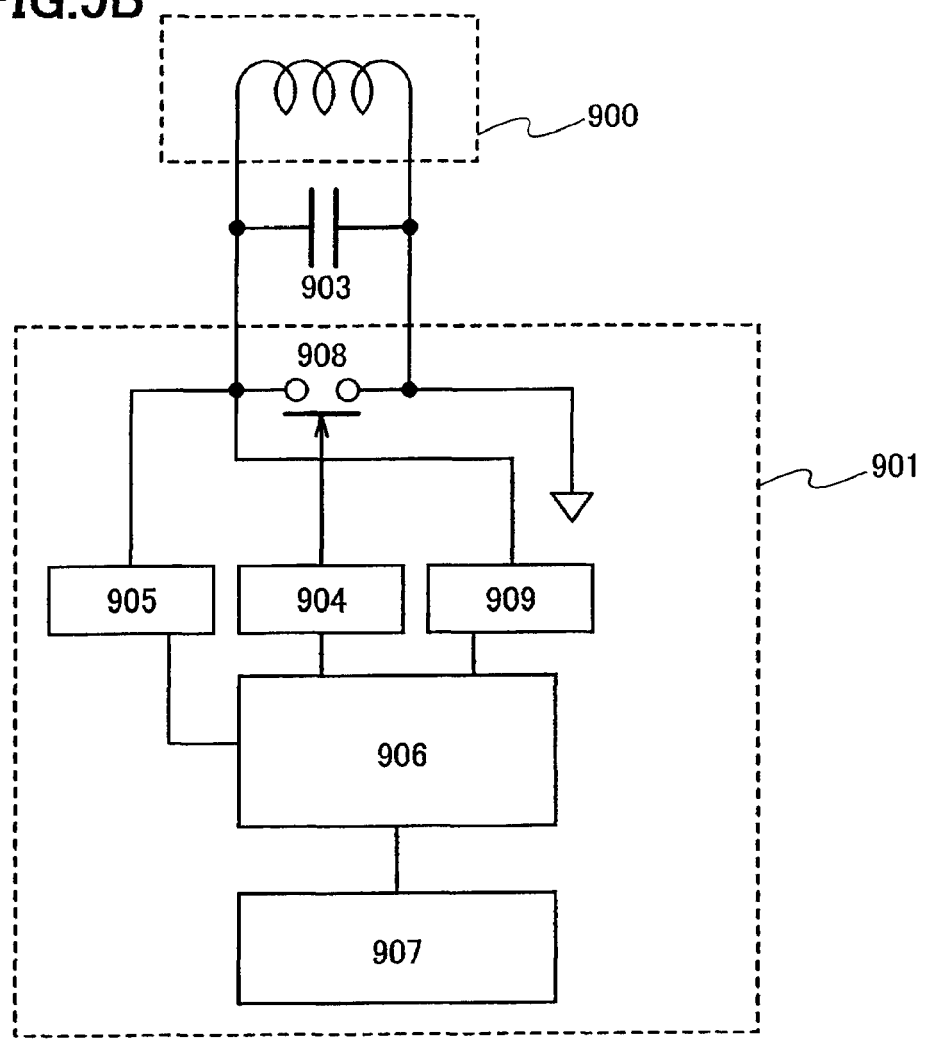

MANUFACTURING METHOD OF SEMICONDUCTOR DEVICE INCLUDING PEELING LAYERS FROM SUBSTRATES BY ETCHING

BACKGROUND OF THE INVENTION

1. Field of the Invention

The present invention relates to a semiconductor device having a circuit including a thin film transistor (hereinafter referred to as a TFT) and a manufacturing method thereof. For example, the invention relates to an electro-optical device typified by a liquid crystal display device having a liquid crystal display panel, a light emitting display panel including an organic light emitting element, or an electronic device on which an integrated circuit having an antenna is mounted as a part.

In this specification, a semiconductor device refers to all types of devices which can function by using semiconductor characteristics. An electro-optical device, a semiconductor circuit, and an electronic device are included in the category of all semiconductor devices.

2. Description of the Related Art

Recently, a technique of making a thin film transistor (TFT) using a semiconductor thin film (approximately, having a thickness of several nm to several hundreds nm) formed over a substrate having an insulating surface has been focused. The thin film transistor is widely applied to electronic devices such as ICs and an electro-optical device. Rapid development of a thin film transistor particularly as a switching element of an image display device is made.

Though various applications using such an image display device are expected, an application to portable devices is particularly focused. A glass substrate or a quartz substrate is currently used in many cases; however, there is a problem in that it is heavy and easily broken. In addition, a glass substrate and a quartz substrate are not suitable for mass production since they have a difficulty of being increased in size. Thus, formation of a TFT element over a flexible substrate, typically, over a flexible plastic film is tried.

However, since the plastic film has low heat resistance, maximum process temperature is required to be low. As a result, a TFT having more favorable electric characteristics than that in the case of forming a TFT over a glass substrate cannot be formed in the present situation. Accordingly, a liquid crystal display device or a light emitting element using a plastic film, which has high performance, is not realized.

At the situation, a technique is proposed, in which an element formed over a glass substrate is peeled from the substrate and transferred to another base material, for example, a plastic film or the like.

The present applicant (the assignee) proposes a peeling and transferring technique described in Reference 1 and Reference 2 (Reference 1: Japanese Patent Laid-Open No. H8-288522, and Reference 2: Japanese Patent Laid-Open No. H8-250745). In Reference 1, a technique in which a silicon oxide film to be a peeling layer is peeled by wet etching to be removed is described. In addition, a technique in which a silicon film to be a peeling layer is peeled by dry etching to be removed is described in Reference 2.

Further, the present applicant (the assignee) proposes a peeling and transferring technique described in Reference 3 (Reference 3: Japanese Patent Laid-Open No. 2003-174153). In Reference 3, a technique is described, in which, when a metal layer is formed over a substrate and an oxide layer is laminated thereover, a metal oxide layer of the metal layer is formed at an interface between the metal layer and the oxide layer and peeling is performed in a subsequent step by using the metal oxide layer.

In addition, the present applicant (the assignee) describes a technique in Reference 4, in which wind pressure of a gas blown from a nozzle in peeling, an ultrasonic wave, or the like is used (Reference 4: Japanese Patent Laid-Open No. 2003-163338).

SUMMARY OF THE INVENTION

It is an object of the present invention to provide a structure and a method of transferring an integrated circuit including a TFT to a flexible substrate in a shorter time than in a conventional way and manufacturing a semiconductor device with low cost and high yield.

One feature of the invention is to supply an etching gas or an etchant (also refers to an etching liquid or an etching solution) to a peeling layer (also refers to a separation layer) or an interface thereof so as to promote peeling, when a layer to be peeled is peeled from a substrate by a physical force.

Specifically, a tungsten film (or an alloy film such as a tungsten nitride film) to be a peeling layer is formed over a glass substrate by sputtering, and a silicon oxide film is laminated thereover by sputtering. Then, an element such as a TFT is formed over the silicon oxide film, and a protective layer is formed. A plurality of opening portions reaching the peeling layer is formed to introduce an etching gas or an etchant. Subsequently, the etching gas or the etchant is introduced from the opening portions, and a layer to be peeled is peeled from the substrate with a physical force applied. Further, the peeling layer is kept supplied with the etching gas or the etchant so as to promote peeling while peeling of the layer to be peeled is conducted.

The etching gas or the etchant used in the invention is typically a gas or a liquid containing halogen (halide), though it depends on a material of the peeling layer. For example, in a case of using tungsten for the peeling layer, $ClF_3$, $CF_4$, $SF_6$, $NF_3$, $F_2$, or the like is used as the etching gas. For example, when silicon is used for the peeling layer, a solution or the like containing hydrofluoric acid (HF) is used as the etchant. Further, when silicon oxide is used as the peeling layer, a solution or the like containing ammonium hydrogen fluoride ($NH_4F$) can be used as the etchant.

In addition, peeling may be performed by a physical force after attaching an auxiliary substrate to the protective layer. There is not a particular limitation on the auxiliary substrate, as long as it is rigid; however, a substrate having flexibility is preferably used.

By applying a physical force, peeling is performed at an interface between the peeling layer and the layer to be peeled. In addition, the etching gas or the etchant is supplied to the peeling layer to generate a chemical reaction; accordingly, peeling becomes easier to be performed. The layer to be peeled which has been thus peeled (including an element such as a TFT) is transferred to a plastic substrate.

"Application of the physical force" in this specification refers to applying a force by a means recognized by not chemistry but physics, specifically, by a dynamic means or a pneumatic means including a process capable of being applied to law of thermodynamics. "Peeling by the physical force" refers to peeling by an external impact (stress) by using, for example, a material, the human hand, wind pressure of a gas blown from a nozzle, supersonic wave, or the like.

One feature of a manufacturing method of a semiconductor device according to the invention disclosed in this specification is to include a first step of forming a peeling layer over a substrate having an insulating surface; a second step of forming a layer to be peeled including a plurality of thin film integrated circuits over the peeling layer; and a third step of peeling the layer to be peeled provided over the peeling layer from the substrate in an atmosphere of an etching gas.

In addition, a layer to be peeled can be peeled from a substrate while being blown by an etching gas. One structure of the invention is to include a first step of forming a peeling layer over a substrate having an insulating surface; a second step of forming a layer to be peeled including a plurality of thin film integrated circuits over the peeling layer; and a third step of removing the peeling layer by blowing an etching gas thereto while the layer to be peeled provided over the peeling layer is peeled from the substrate in an atmosphere of an etching gas.

In addition, a layer to be peeled can be peeled from a substrate in a liquid. One structure of the invention is to include a first step of forming a peeling layer over a substrate having an insulating surface; a second step of forming a layer to be peeled including a plurality of thin film integrated circuits over the peeling layer; and a third step of removing the peeling layer by supplying an etchant while the layer to be peeled provided over the peeling layer is peeled from the substrate in an etchant.

In each structure mentioned above, the peeling layer is a single layer formed of an element selected from Si, W, Ti, Ta, Mo, Cr, Nd, Fe, Ni, Co, Zr, Zn, Ru, Rh, Pd, Os, or Ir, or an alloy material or a compound material containing the element as its main component. In addition, the peeling layer is not limited to a single layer in the invention and may be a laminated layer thereof.

In a case of using Si as the peeling layer, $ClF_3$, $CF_4$, $SF_6$, $NF_3$, $F_2$, or the like can be used as the etching gas. In the case of using Si as the peeling layer, a tetramethylammonium hydroxide solution called TMAH, a KOH solution, an $N_2H_4$ solution, an NaOH solution, a CsOH solution, or the like can be used as the etchant, as well as a solution containing hydrofluoric acid (HF).

Further, in a case of using W, Mo, or Cr as the peeling layer, an aqueous solution containing $HNO_3$ and $(NH_4)_2Ce(NO_3)_6$, or the like can be used as the etchant.

In each structure described above, one feature is that the thin film integrated circuit includes a TFT, and a CPU can be formed by using the TFT. In addition, by providing an antenna in the thin film integrated circuit, a semiconductor device having a function of sending and receiving can be formed.

In addition, by a manufacturing method of the invention, a thin film integrated circuit including a TFT can be peeled off from a glass substrate and further transferred to a flexible substrate. By transferring the thin film integrated circuit including a TFT to the flexible substrate, mass production can be realized, in which many thin film integrated circuits are formed over one substrate. Further, by transferring a thin film integrated circuit to a flexible substrate, a semiconductor device itself, on which the thin film integrated circuit is mounted, can be reduced in weight.

According to the invention, by utilizing both a physical force and a chemical reaction, peeling can be smoothly performed in a short time.

BRIEF DESCRIPTION OF DRAWINGS

In the accompanying drawings:

FIGS. 4A and 4B are cross-sections of semiconductor devices (Embodiment 1);

FIGS. 5A and 5B are a perspective view and a block diagram of a semiconductor device (Embodiment 2);

DETAILED DESCRIPTION OF THE INVENTION

Embodiment Mode

Figure 1A:
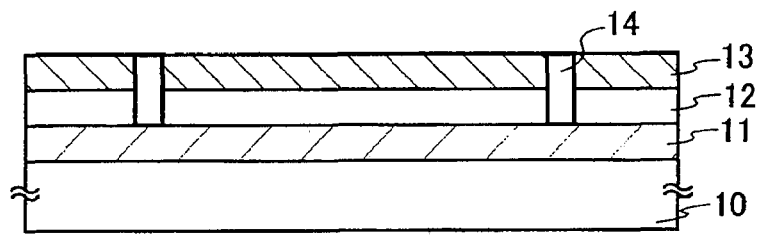
FIGS. 1A and 1B show cross-sections of a manufacturing process of the present invention (Embodiment Mode 1)

Embodiment Mode of the present invention is hereinafter described.

Embodiment Mode 1

In Embodiment Mode 1, a manufacturing method is described, in which a layer to be peeled including a TFT formed over a glass substrate is peeled off from the glass substrate and then transferred onto a plastic substrate. Here, an example of removing a layer to be peeled with a halogen gas blowing to a peeling layer in an atmosphere containing a halogen gas is described.

First, a peeling layer 11 is formed on a glass substrate 10. As the peeling layer 11, a single layer or a laminated layer formed of an element selected from W, Ti, Ta, Mo, Cr, Nd, Fe, Ni, Co, Zr, Zn, Ru, Rh, Pd, Os, or Ir, or an alloy material or a compound material containing the element as its main component can be used. Alternatively, a single layer or a laminated layer formed of nitride of the above-described element such as titanium nitride, tungsten nitride, tantalum nitride, or molybdenum nitride can be used. The thickness of the peeling layer 11 is 10 nm to 200 nm, preferably 50 nm to 75 nm.

In this embodiment mode, a tungsten (W) film is used as the peeling layer.

Next, an insulating film is formed over the peeling layer 11. At this time, an amorphous metal oxide film with a thickness of about 2 nm to 5 nm is formed between the peeling layer 11 and the insulating film. When peeling is performed in a subsequent step, the separation occurs inside the metal oxide film, at an interface between the metal oxide film and the insulating film, or at an interface between the metal oxide film and the metal film. The insulating film may be formed of silicon oxide, silicon oxynitride, or a metal oxide material by sputtering. It is preferable that the thickness of the insulating film be more than about twice the thickness of the peeling layer 11, preferably 150 nm to 200 nm.

Subsequently, a film formed of a material containing at least hydrogen is formed over the insulating film. As the film formed of a material containing at least hydrogen, a semiconductor film, a nitride film, or the like can be applied. A semiconductor film is formed in this embodiment mode. After that, a thermal treatment is performed for diffusing the hydrogen contained in the film of a material containing at least hydrogen. This thermal treatment may be performed at a temperature of 410° C. or higher, and may be performed separately from a forming process of a polysilicon film or may be performed together with the forming process of a polysilicon film so as to reduce the number of steps. For example, in a case where an amorphous silicon film containing hydrogen is used as the film of the material containing hydrogen and heated to form a polysilicon film, if the thermal treatment is performed at a temperature of 500° C. or higher for crystallization, diffusion of hydrogen can be performed together with the formation of the polysilicon film.

Next, by a known technique, the polysilicon film is etched into a desired shape so that a layer including a plurality of TFTs is formed. For example, a central processing unit (CPU), a microprocessor unit (MPU), or the like can be formed by using TFTs. In addition, an antenna or the like may be formed. The antenna has a function of sending and receiving electromagnetic field or radio wave. A laminated layer including at least a TFT, formed over the peeling layer 11, is called a layer to be peeled 12.

The TFT has a polysilicon film forming a source region, a drain region, and a channel forming region; a gate insulating film which covers the polysilicon film; a gate electrode formed over the channel forming region of the polysilicon film; and a source electrode and a drain electrode which are connected to the source region and the drain region with an interlayer insulating film interposed therebetween.

Next, a protective layer 13 is formed. The protective layer 13 is formed by using a material which does not react with a halogen gas ($ClF_3$) to be used in a subsequent step, for example, an organic resin. The protective layer 13 is not necessarily provided. Further, in a case of peeling the protective layer after attaching it to an auxiliary substrate, the protective layer is preferably formed of a material which attaches to the auxiliary substrate well.

Then, dry etching or wet etching is performed by using a mask. In this etching step, an opening portion 14 reaching the peeling layer 11 is selectively formed in a region except a region provided with the TFT; a wiring, or the like, so as to expose the peeling layer 11. Alternatively, the opening portion 14 may be formed by using laser light, without using a mask. In the case of using laser light, the layer to be peeled or the peeling layer is removed by laser ablation. For the laser light, a gas laser such as an excimer laser, a $CO_2$ laser, or an argon laser; a solid laser such as a glass laser, a ruby laser, an alexandrite laser, or a Ti: sapphire laser; a solid laser using crystal such as YAG, $YVO_4$, YLF, or $YAlO_3$ which is doped with Nd, Tm, or Ho; or a semiconductor laser is preferably used. In addition, a laser oscillation type may be either continuous oscillation or pulse oscillation. A laser beam may have a linear shape, a rectangular shape, a circular shape, or an elliptical shape. A wavelength to be used may be a fundamental wave, the second harmonic, or the third harmonic, and is preferably selected as appropriate by an operator. A scanning direction may be a longitudinal direction, a transverse direction, or an oblique direction. Further, the laser may be scanned back and forth. In addition, the position of the opening portion 14 is not particularly limited as long as it is not a region provided with the TFT or the wiring, and the opening portion may be appropriately provided. Further, the opening portion 14 may be a hole or a groove having a width.

A cross-section after the aforementioned process is schematically shown in FIG. 1A.

Next, the layer to be peeled 12 is peeled from the substrate 10. The peeling is performed under an atmosphere containing a halogen gas. In this embodiment mode, an atmosphere of a mixed gas of a ClF3 gas and an inert gas (He or $N_2$) is used. In a case of peeling with the human hand, the peeling is performed in a glove box. Alternatively, the peeling may be performed by using a force of a peeling apparatus provided in a sealed chamber. The apparatus is operated with electricity.

In addition, an auxiliary substrate may be attached to the protective layer before peeling, to perform peeling with the layer to be peeled 12 supported.

Figure 1B:
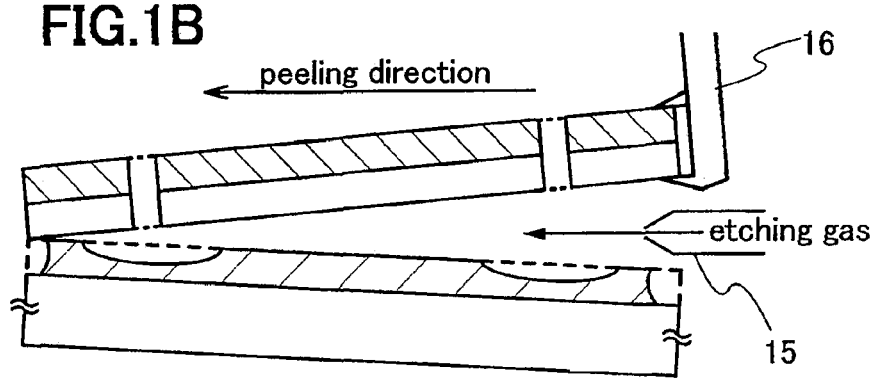

As shown in FIG. 1B, while the layer to be peeled 12 is peeled from the substrate 10 by a physical means 16, a halogen gas is blown to the peeling layer 11 at the same time. Here, a $ClF_3$ gas is blown from a nozzle 15 at a flow rate of 50 sccm. By blowing a halogen gas to a peeling layer, etching of the peeling layer proceeds, and peeling can be performed in a short time. In addition, by airflow generated by blowing a halogen gas, peeling can be promoted.

In addition, peeling may be started after exposing the peeling layer to an atmosphere containing halogen for a short time to slightly etch the peeling layer.

Figure 2A:
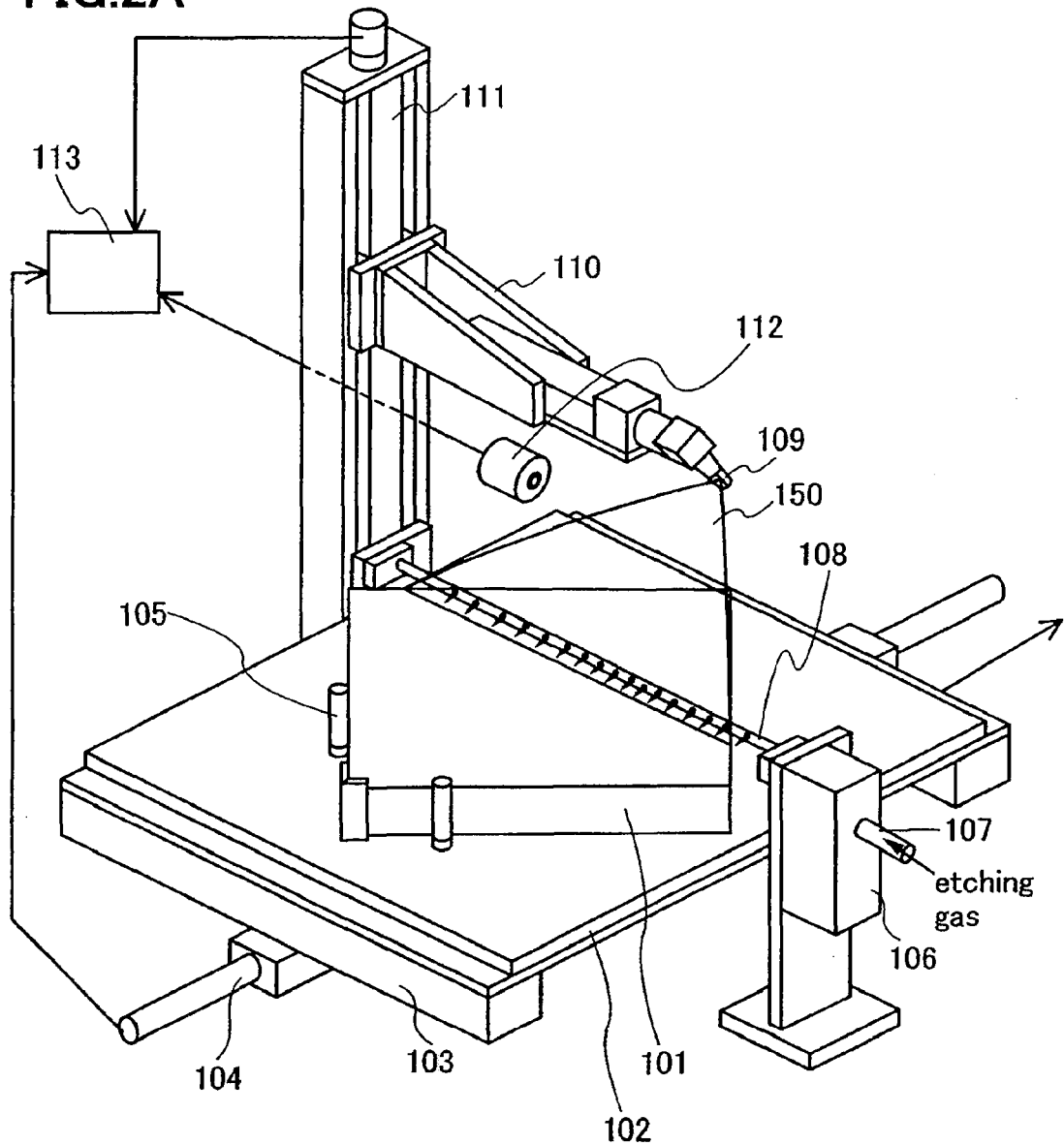
FIGS. 2A and 2B are a perspective view and a cross sectional view of a peeling apparatus used in a manufacturing process of the present invention (Embodiment Mode 2)

An example of a peeling apparatus is shown in FIG. 2A. The peeling apparatus of FIG. 2A is provided in a sealed chamber, and all parts of the peeling apparatus are formed of materials which do not react with a halogen gas.

FIG. 2A is a perspective view of a peeling apparatus when peeling treatment is conducted, in which a layer to be peeled is peeled from a substrate.

A substrate 101 provided with a layer to be peeled and a peeling layer is transferred into a chamber provided with a peeling apparatus by a transfer robot or the like and is fastened by a fast pin 105 provided on a table 102. Further, a vacuum chuck for fastening the substrate 101 to the table 102 may be provided.

In the peeling apparatus, the position of the substrate is aligned by using an imaging portion 112 such as a CCD camera, and an edge of a layer to be peeled 150 is clipped from top-back both sides by a chuck portion 109. In the case of attaching an auxiliary substrate to the layer to be peeled, an edge of the auxiliary substrate is clipped from top-back both sides.

The table 102 which fastens the substrate 101 moves in a direction as shown by the arrow in FIG. 2A by a moving mechanism 104 and a movable plate 103.

A chuck elevator mechanism 110 provided with the chuck portion 109 is moved up and down along with a groove provided in a guide portion 111. After clipping the edge of the layer to be peeled 150 from top-back both sides by the chuck portion, the edge of the layer to be peeled 150 is pulled upward by using the chuck elevator mechanism 110.

In addition, a nozzle 108 is provided with a plurality of holes, and a reaction gas is blown from the holes. The reaction gas is come from a steel cylinder provided at the outside of the chamber through a gas introduction pipe 107 to be blown from the holes. The nozzle 108 can also support the peeling by pressing and fasten the substrate 101 so that the substrate 101 does not move in accordance with the layer to be peeled which is pulled with the chuck portion 109.

The height of the nozzle 108 can be adjusted by a height control mechanism 106.

In addition, an atmosphere in the chamber is a halogen gas, which is a gas for etching a peeling layer 140. In order to efficiently make the chamber to have an atmosphere of a halogen gas in a short time, a gas introduction pipe or an exhausting means may be provided.

The chuck elevator mechanism 110 and the moving mechanism 104 are controlled by a controlling portion 113 which includes a computer, based on data from the imaging portion 112 such as a CCD camera.

Figure 2B:
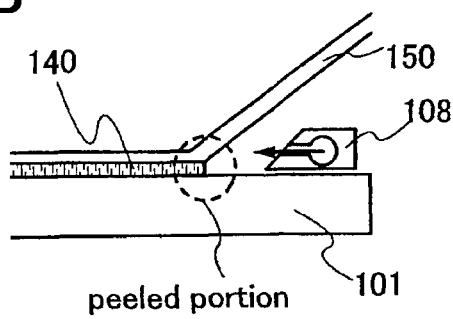

FIG. 2B shows a cross-section of a periphery of a peeled portion during peeling. By blowing an etching gas to the peeled portion, the peeling layer 140 becomes fragile, and the layer to be peeled 150 becomes easy to be torn off from the substrate 101. Note that, as long as the layer to be peeled 150 can be torn off from the substrate 101, a portion of the peeling layer 140 may remain on the layer to be peeled 150.

In addition, the layer to be peeled in the peeled portion may be peeled with being pressed by a nozzle, which has a cross-section of a wedge shape.

Since the peeling apparatus shown in FIG. 2A has the fast pin 105, the nozzle 108 stops short of the fast pin 105. Accordingly, in a case of completely peeling the layer to be peeled from the substrate 101, etching is performed by using an atmosphere in the chamber or the reaction gas blown from the nozzle 108. In consideration of easiness of transfer, the substrate may be transferred outside the chamber without peeling a portion of the layer to be peeled, and later, the layer to be peeled may be completely peeled from the substrate 101 by peeling the portion of the layer to be peeled.

In this embodiment mode, by forming a metal oxide film ($WO_x$) over a metal film of W which is a peeling layer, the attachment of a peeling layer and an insulating film made of an oxide material (a film made of silicon oxide, silicon oxynitride, or a metal oxide material) becomes weak, and peeling becomes easy to be performed. Then, it becomes possible to easily separate a thin film integrated circuit from a substrate without completely removing a peeling layer.

Peeling can be smoothly performed by using a method in which a layer to be peeled is peeled with blowing a halogen gas to a peeling layer to be removed in an atmosphere containing a halogen gas. Accordingly, a peeling treatment can be automated by using a peeling apparatus shown in FIGS. 2A and 2B.

Then, by transferring the layer to be peeled which has been peeled from the substrate 101 to a flexible substrate such as a plastic film, a high-performance semiconductor integrated circuit (such as a sending and receiving circuit including a CPU, a memory, or an antenna) using a flexible substrate can be realized.

Further, when a flexible substrate is used as an auxiliary substrate, peeling from a glass substrate and the transfer to a flexible substrate are completed at once.

According to the present invention, a TFT provided over a glass substrate can be transferred to a flexible substrate in a short time. When the flexible substrate to which the TFT is transferred is used, a liquid crystal display device or a light emitting element using the flexible substrate can be realized.

Embodiment Mode 2

Though an example of performing the peeling in a halogen gas atmosphere is described in Embodiment Mode 1, an example of performing peeling in an etchant will be described here.

Similarly to Embodiment Mode 1, a peeling layer 21 is formed over a glass substrate 20, and an insulating film and a layer to be peeled 22 including a plurality of TFTs, which is provided over the insulating film, are formed. In this embodiment mode, a silicon film is used as the peeling layer 21. A protective layer 23 is formed in the same manner as in Embodiment Mode 1. The protective layer 23 is formed using a material which does not react with an etchant to be used in a subsequent step, for example, an organic resin.

Subsequently, dry etching or wet etching is performed using a mask. In this etching step, an opening portion 24 reaching the peeling layer 21 is selectively formed in a region except a region provided with the TFT, a wiring, or the like, so as to expose the peeling layer 21. In addition, the position of the opening portion 24 is not particularly limited as long as it is not a region provided with the TFT or the wiring, and the opening portion may be appropriately provided. Further, the opening portion 24 may be a hole or a groove having a width.

Figure 3A:
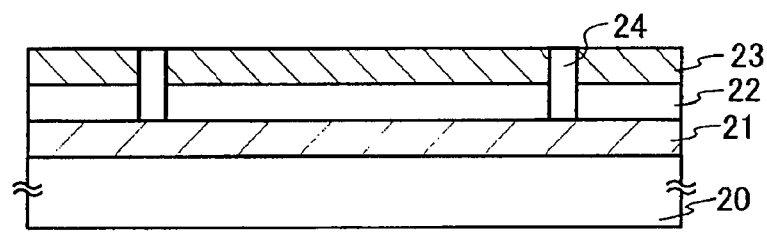
FIGS. 3A and 3B show cross-sections of a manufacturing process of the present invention (Embodiment Mode 2)

A cross-section after the aforementioned process is shown in FIG. 3A.

Next, the layer to be peeled 22 is peeled from the substrate 20. Peeling is performed in an etchant by soaking the substrate 20 in a liquid tank 27 in which a liquid containing halogen is contained. In this embodiment mode, a mixed solution of hydrofluoric acid (HF) and nitric acid ($HNO_3$) is used as the etchant which can etch silicon. As another etchant for etching silicon, a tetramethylammonium hydroxide solution called TMAH, a KOH solution, an $N_2H_4$ solution, an NaOH solution, a CsOH solution, or the like can be used. Further, as another etchant for etching silicon, a mixed solution of dimethylsulfoxide and monoethanolamine can be used.

Figure 3B:
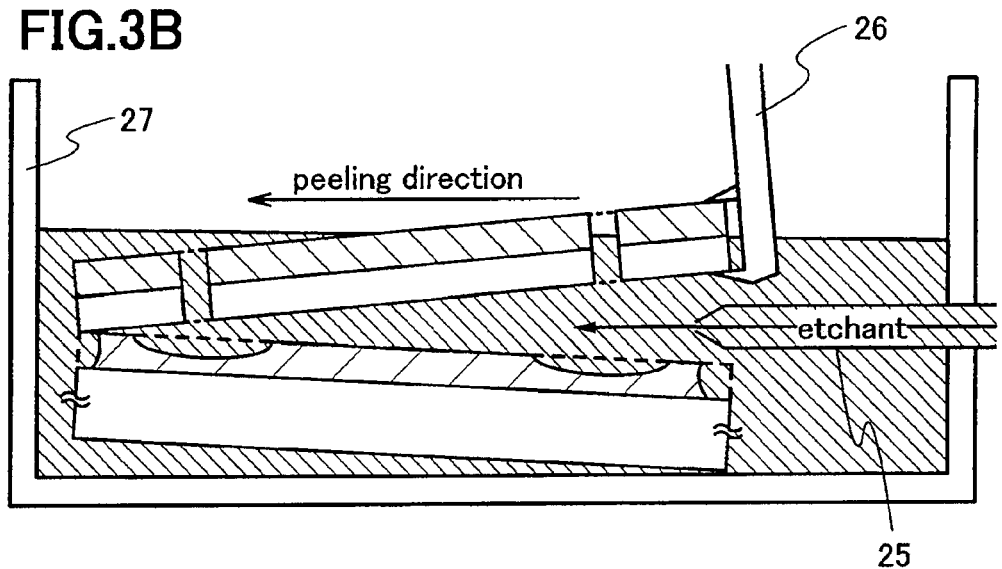

As shown in FIG. 3B, while the layer to be peeled 22 is peeled from the substrate 20 by a physical means 26, a reaction liquid (a liquid containing halogen) is supplied to the peeling layer 21 from a nozzle 25 at the same time. By continuously providing an etchant to a peeling layer, etching of the peeling layer proceeds, and peeling can be performed in a short time. In addition, by water flow generated by providing a reaction liquid, peeling can be promoted.

An etchant including more component which reacts with silicon than that of the etchant contained in the liquid tank 27 in advance, may be provided from the nozzle. By discharging the etchant from a nozzle, a peeling layer can be etched in a shorter time. In addition, the use amount of a liquid material can be reduced, comparing with a case of entirely replacing a solution in the liquid tank 27 every time completing one peeling.

Further, an etchant having a higher temperature than that of the etchant contained in the liquid tank 27 in advance may be provided from the nozzle. By discharging an etchant having a higher temperature from a nozzle, a peeling layer can be etched in a short time.

In addition, by pulling out the layer to be peeled from the etchant by a physical means 26, a peeled portion of the layer to be peeled can be immediately prevented from being exposed to the etchant. Accordingly, a peeling method of this embodiment mode can be said to be a peeling method with few damages to the layer to be peeled.

Then, by transferring the peeled layer to be peeled 22 from the substrate 20 to a flexible substrate such as a plastic film, a high-performance semiconductor integrated circuit (a sending and receiving circuit including a CPU, a memory, or an antenna) using a flexible substrate can be realized.

Further, when a flexible substrate is used as an auxiliary substrate, peeling from a glass substrate and the transfer to a flexible substrate are completed at once.

According to the present invention, a TFT provided over a glass substrate can be transferred to a flexible substrate in a short time. When the flexible substrate to which the TFT is transferred is used, a liquid crystal display device or a light emitting element using a flexible substrate can be realized.

In addition, this embodiment mode can be feely combined with Embodiment Mode 1. For example, peeling in an etchant becomes possible when the peeling apparatus described in Embodiment Mode 1 is provided at the bottom of the liquid tank instead of providing to the chamber, the peeling apparatus is soaked in the etchant, and a nozzle for discharging the etchant is provided instead of a nozzle for discharging a gas. Note that, in this case, materials which do not react with the etchant are used for all parts of the peeling apparatus.

The present invention including the structure will be explained in more detail in the following embodiment.

Embodiment 1

In Embodiment 1, a case of using a thin film integrated circuit as an IC chip will be described.

The IC chip can be roughly divided into three types: a contactless type IC chip mounted with an antenna (also referred to as a wireless tag), a contact type IC chip provided with a terminal connected to an external power source without a mounted antenna, and a hybrid type IC chip which is a combination of the contactless type and the contact type.

In the case of using the thin film integrated circuit as the contact type IC chip, the thin film integrated circuit peeled by a peeling method of the present invention can be used by being directly mounted on an article.

On the other hand, in the case of using the thin film integrated circuit as the contactless type IC chip or the hybrid type IC chip, the integrated circuit is preferably used with a mounted antenna. Examples of a cross-sectional view of the IC chip, on which an antenna is mounted, are shown in FIGS. 4A and 4B. Note that cross-sectional views of FIGS. 4A and 4B show the state before peeling the IC chip from a substrate.

FIG. 4A is a cross-sectional view of an IC chip in which an antenna 232 is directly formed over a layer to be peeled including a thin film integrated circuit formed of TFTs 201a and 201b.

After forming up to wirings 207a to 207c of the TFTs, an interlayer insulating film 231 is formed to cover the wirings 207a to 207c. The interlayer insulating film 231 can be anything as long as it is an insulating film obtained by a PCVD method or a coating method. In this embodiment, the interlayer insulating film is formed by a coating method using siloxane polymer.

Subsequently, contact holes are formed in the interlayer insulating film 231 to reach the wirings 207a and 207c. Then, antennas 232 are formed to be electrically connected to the wiring 207a or 207c. As a material of the antenna 232, a conductive metal material such as Ag, Al, Au, Cu, or Pt can be used. In the case of using Al or Au which has relatively high resistance, the wiring resistance may become of concern. However, the wiring resistance can be reduced by thickening or widening the antenna. Alternatively, antennas may be laminated and covered with a material having low resistance. In the case of using a conductive material such as Cu, which has a fear to be diffused, an insulating film is preferably formed to cover a surface provided with an antenna or a periphery of Cu.

Next, a protective layer 233 is formed to cover the antenna 232.

Subsequently, by using a peeling method described in Embodiment Mode 1 or 2, a peeling layer can be removed, so that an IC chip is peeled off from a substrate. A peeling method of the invention enables peeling in a short time and also enables the reduction of damages to a layer to be peeled.

After that, the peeled IC chip is divided into pieces, and the pieces of the IC chip can be used by being mounted on articles or the like. Alternatively, the IC chip can be used by mounting it on an article or the like after the layer to be peeled is attached to a flexible substrate.

FIG. 4B is a cross-sectional view showing a case of attaching an antenna substrate 235 provided in advance with an antenna 234, to a substrate provided with a layer to be peeled including a thin film integrated circuit formed of TFTs 201a and 201b with an adhesive or the like.

As an attaching means of two substrates, an anisotropic conductor 236 including dispersed conductors 237 can be used. The anisotropic conductor 236 can be conductive in a region 239 which is provided with a connection terminal 238 of the IC chip and a connection terminal of the antenna 234, since the conductors 237 are bonded to each other by pressure due to the thickness of each connection terminal. In the other region, wirings formed over the substrate are not electrically connected to each other since a sufficient distance between the conductors is kept. Instead of using the anisotropic conductor, the two substrates may be attached to each other with an ultraviolet curing resin, two-sided tape, or the like. Alternatively, ultrasonic bonding can be employed to attach two substrates.

Subsequently, by using a peeling method described in Embodiment Mode 1 or 2, a peeling layer can be removed, so that the IC chip is peeled off from the substrate. A peeling method of the invention enables peeling in a short time and also enables the reduction of damages to a layer to be peeled.

After that, the peeled IC chip is divided into pieces, and the pieces of the IC chip can be used by being mounted to articles or the like. In this case, since the layer to be peeled is fixed on the antenna substrate 235, the IC chip can be used by being directly mounted on an article or the like.

Note that, in a case where the IC chip has a fear of warping due to stress or the like when peeled from the substrate, a protective film is preferably formed over the antenna substrate 235.

In addition, since the IC chip shown in this embodiment is formed by using not a silicon substrate but a thin film integrated circuit formed over an insulating substrate, there are fewer limitations on the shape of a mother substrate, comparing with a chip formed by using a circular silicon substrate. Therefore, cost of the IC chip can be reduced. An IC chip of the present embodiment uses, unlike a chip formed by using a silicon substrate, a semiconductor film having a thickness of 0.2 μm or less, typically 40 nm to 170 nm, preferably 50 nm to 150 nm, as an active region; accordingly, the IC chip becomes very thin. As a result, even when the IC chip is mounted on an article, the existence of the thin film integrated circuit is hard to be recognized, which prevents falsification such as forgery.

In addition, the IC chip shown in this embodiment has, comparing with a chip formed by using a silicon substrate, less concern about radio wave adsorption. Therefore, a signal can be received with high sensitivity. Further, the thin film integrated circuit without including a silicon substrate has a light transmitting property. As a result, the thin film integrated circuit can be applied to various articles. For example, even when the integrated circuit is mounted on a printing surface of an article, the design is not harmed.

The present embodiment can be freely combined with Embodiment Mode 1 or 2.

Embodiment 2

In Embodiment 2, a structure of an IC chip manufactured by a peeling method according to the present invention will be explained.

FIG. 5A is a perspective view of one mode of an IC chip. Reference numeral 920 denotes an integrated circuit and 921 denotes an antenna. The antenna 921 is electrically connected to the integrated circuit 920. Reference numeral 922 denotes a flexible substrate and 923 denotes a cover material. The integrated circuit 920 and the antenna 921 are sandwiched between the flexible substrate 922 and the cover material 923.

After forming an integrated circuit and an antenna over a glass substrate, peeling may be performed by using a peeling method of the present invention to transfer the integrated circuit and the antenna to a flexible substrate. Alternatively, after forming an integrated circuit over a glass substrate, an antenna provided in a cover material may be mounted to be electrically connected to the integrated circuit, and peeling may be performed by a peeling method of the invention. Then, the integrated circuit and the antenna may be transferred to a flexible substrate. A peeling method of the invention enables peeling in a short time and also enables the reduction of damages to a layer to be peeled.

Next, FIG. 5B is a block diagram showing one mode of a functional structure of the IC chip shown in FIG. 5A.

In FIG. 5B, reference numeral 900 denotes an antenna; 901, an integrated circuit; and 903, a capacitor formed between terminals of the antenna 900. The integrated circuit 901 has a demodulation circuit 909, a modulation circuit 904, a rectification circuit 905, a microprocessor 906, a memory 907, and a switch 908 for giving load modulation to the antenna 900. The number of memories 907 is not limited to one, and a plurality of memories such as an SRAM, a flash memory, a ROM, and an FRAM (registered trademark) can be used.

A signal sent from a reader/writer as an electric wave is converted into an alternating electric signal by electromagnetic induction in the antenna 900. The demodulation circuit 909 demodulates the alternating electric signal to send it to the microprocessor 906 in a subsequent stage. The rectification circuit 905 generates power source voltage by using the alternating electric signal to supply it to the microprocessor 906 in the subsequent stage. The microprocessor 906 carries out various kinds of arithmetic processing in accordance with the inputted signal. The memory 907 stores a program and data used in the microprocessor 906. In addition, the memory 907 can be used as a working area in the arithmetic processing.

When data is sent from the microprocessor 906 to the modulation circuit 904, the modulation circuit 904 can control the switch 908 to apply load modulation to the antenna 900 in accordance with the data. As a result, the reader/writer can read out the data from the microprocessor 906 by receiving an electric wave of the load modulation given to the antenna 900.

The IC chip does not necessarily have the microprocessor 906. The transmission system of a signal is not limited to the foregoing electromagnetic coupling system as shown in FIG. 5B. The electromagnetic induction system, a microwave system, or another transmission system may be used.

Since an IC chip having an antenna can transmit information, the IC chip can be used as a wireless memory or a wireless processor.

In addition, a security system can be established using the IC chip having an antenna. The following is a general explanation of the system.

Authentication is precisely performed by combining a plurality of card-shaped recording media 1001, on each of which an antenna 921 and an integrated circuit 920 including a microprocessor are mounted.

Figure 6A:
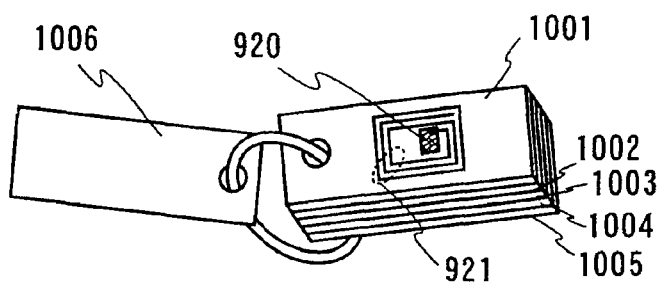
FIGS. 6A and 6B are a perspective view of a thin film integrated circuit of the invention and a block diagram of a system using the thin film integrated circuit.

FIG. 6A is a perspective view of a plurality of card-shaped recording media, which are brought together with a ring. Though an antenna 921 and an integrated circuit 920 are shown in FIG. 6A for clear presentation, they are preferably sealed with a colored film so as not to be seen, in the interests of crime prevention.

Card-shaped recording media 1001 to 1005 each record different identification data. Then, by holding the recording media to a reader provided to a door which is provided with a key control system, all identification data is read out, and locking and unlocking of the key control system are performed based on the read-out data. In addition, a card-shaped recording medium 1006 for a warning signal is brought together with a ring as well, and the card-shaped recording media 1001 to 1005 other than the card-shaped recording medium for a warning signal are held to the reader. When a person who does not know this system holds the card-shaped recording medium 1006 for a warning signal, in addition to the other card-shaped recording media, to a reader, a warning signal rings, or calling to a security agency is conducted. Since the card-shaped recording media are brought together with a ring, the order of the card-shaped recording media can be changed. For example, a card-shaped recording medium positioned at the top can be moved to the back.

An example of using six recording media including five card-shaped recording media for authentication and one card-shaped recording medium for a warning signal is shown in FIG. 6A; however, the number of the recording media is not particularly limited as long as there are three or more recording media including at least two card-shaped recording media for authentication and one card-shaped recording medium for a warning signal.

In addition, instead of using the card-shaped recording medium for a warning signal, a card for interrupting a signal from a reader may be used. For example, when the card for interrupting a signal from a reader, which is interposed between two card-shaped recording media for authentication, is held to a reader, the identification data of only one card-shaped recording medium for authentication is read out.

An example of bringing together a plurality of the card-shaped recording media with a ring is shown in FIG. 6A; however, there is no particular limitation, and a plurality of card-shaped recording media having a card size may put in a wallet or a card case.

All the identification data is not recorded in one card-shaped recording medium. By dividing the identification data into a plurality of cards and mixing a card for a warning signal, security is improved. In addition, by using a plurality of cards, more identification data can be recorded.

Figure 6B:
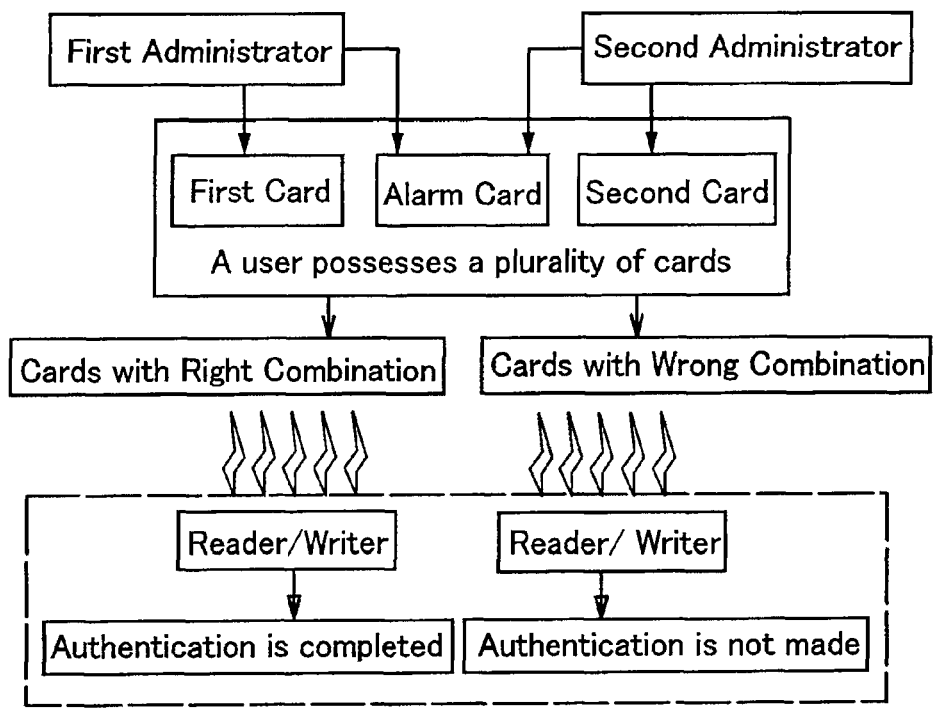

A plurality of card-shaped recording media is preferably provided by at least a plurality of administrators. An example of a block diagram of the control system is shown in FIG. 6B.

The security system shown here is a system which includes a plurality of card-shaped recording media, an information reader (reader) for reading out the information recorded in the recording media, and a key control system which decides whether or not to authorize a user of the recording media to enter a predetermined area based on the information read out from the information reader.

This security system is a system in which a first identification data is recorded in a first card-shaped recording medium and a second identification data is recorded in a second card-shaped recording medium, and which authorizes the user to enter a predetermined area only when the first and the second identification data is read out at the same time by the information reader.

The user takes the first card for authentication from a first administrator and the second card for authentication from a second administrator. The first and the second administrators are, for example, manufacturers of different card-shaped recording media from each other. The identification data provided from the first and the second administrators are different from each other Since cards are provided from a plurality of administrators, even when the information of one administrator is leaked or one card is forged, a key control system can be continuously controlled.

An alarm card for a warning signal is supplied from either or both of the first and the second administrators. A plurality of supplied cards each has a different design. Cards for authentication and an alarm card are designed so that a person except the user supplied with the cards cannot identify the difference of the cards by appearances.

The user possesses the first card, the second card, and the alarm card. When the cards with the right combination (here, the combination of the first and the second cards) are held to a reader/writer, authentication is completed. If the cards with the wrong combination (for example, the first card and the alarm card) are held to the reader/writer, authentication is not made.

The present embodiment can be freely combined with Embodiment Mode 1, Embodiment Mode 2, or Embodiment 1.

Embodiment 3

Figure 7A:
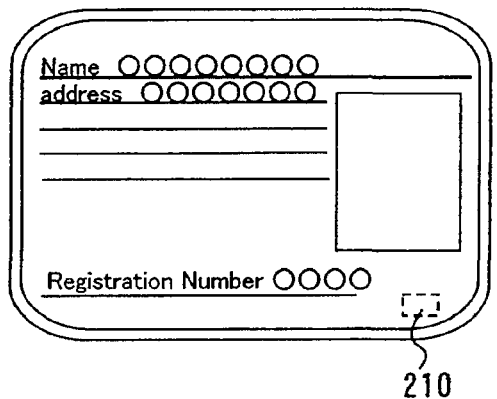
FIGS. 7A to 7F are articles on which thin film integrated circuits of the invention are mounted.
Figure 7B:
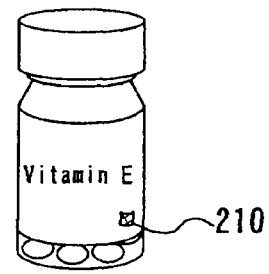
Figure 7C:
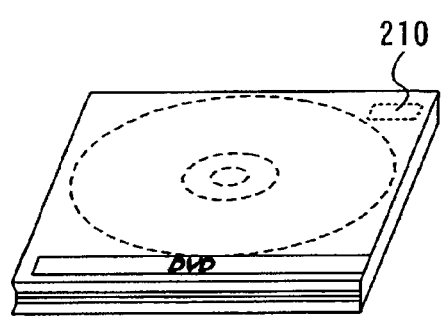
Figure 7D:
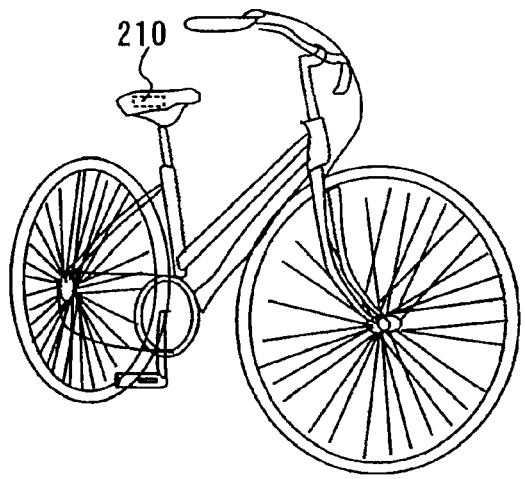

In Embodiment 3, the application of a thin film integrated circuit shown in the aforementioned embodiment modes or the embodiments will be described. A thin film integrated circuit peeled from a substrate can be used as an IC chip. For example, an IC chip 210 can be used by providing it to paper money, coins, securities, bearer bonds, certificates (a driver's license, a certificate of residence, or the like, see FIG. 7A), packing containers (wrapping paper, bottles, or the like, see FIG. 7B), recording media such as DVD software, a CD, and a video tape (see FIG. 7C), vehicles such as a car, a motorcycle, and a bicycle (see FIG. 7D), personal belongings such as a bag and glasses, foods, clothing, commodities, electronic devices, or the like. The electronic devices refer to a liquid crystal display device, an EL display device, a television device (also called TV or TV sets), a cellular phone, and the like.

Figure 7E:
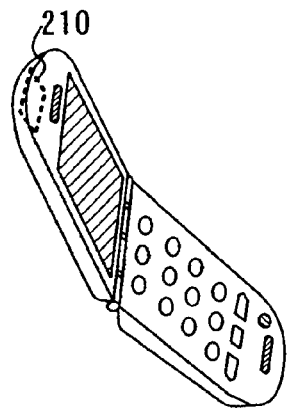

An example of mounting the IC chip 210 on a cellular phone is shown in FIG. 7E. The IC chip 210 having an antenna which corresponds to a frequency different from that of a transmitting and receiving antenna of the cellular phone may be mounted, by which conversation, mail exchange, or the like can be made.

The IC chip 210 is mounted on an electronic device such as a cellular phone for person authentication. Then, the electronic device can be used for authentication at an automatic ticket gate, at a gate of an exhibition hall or a laboratory, as a key to the front door, or for keyless entry to a car.

Figure 7F:
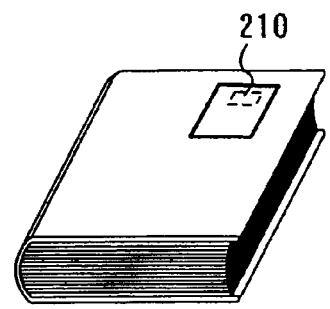

The IC chip can be fixed to an article by attaching to a surface or embedding thereinto. For example, in a case of a book as shown in FIG. 7F, the IC chip may be embedded in a piece of paper; or in a case of a package made from an organic resin, the IC chip may be embedded in the organic resin. Forgery can be prevented by providing an IC chip to each of the paper money, coins, securities, bearer bonds, certificates, and the like. The efficiency of an inspection system or a system used in a rental shop can be promoted by providing an IC chip to each of the packing containers, recording media, personal belongings, foods, clothing, commodities, electronic devices, and the like. By providing an IC chip to the vehicles, counterfeits or theft can be prevented.

The present embodiment can be freely combined with Embodiment Mode 1, Embodiment Mode 2, Embodiment 1, or Embodiment 2.

By a manufacturing method of the present invention, a thin film integrated circuit including a TFT with high performance can be peeled from a glass substrate in a short time. In addition, the thin film integrated circuit including a TFT can be transferred to a flexible substrate. According to the invention, mass production is possible, in which many thin film integrated circuits are formed over one large sized substrate.

This application is based on Japanese Patent Application serial no. 2005-056308 filed in Japan Patent Office on Mar. 1, 2005, the entire contents of which are hereby incorporated by reference.

What is claimed is:

1. A manufacturing method of a semiconductor device, comprising:
    forming a peeling layer over a substrate having an insulating surface;
    forming a layer to be peeled including a plurality of thin film integrated circuits over the peeling layer; and
    peeling the layer to be peeled provided over the peeling layer from the substrate by applying a force to the layer to be peeled in an atmosphere of an etching gas that generates a chemical reaction with the peeling layer,
    wherein a nozzle is used to blow the etching gas to the peeling layer and the peeling layer is exposed to the atmosphere of the etching gas prior to blowing the etching gas by the nozzle.

2. The manufacturing method of a semiconductor device according to claim 1, wherein the peeling layer is a single layer formed of an element selected from Si, W, Ti, Ta, Mo, Cr, Nd, Fe, Ni, Co, Zr, Zn, Ru, Rh, Pd, Os, or Ir, or an alloy material or a compound material containing the element as its main component.

3. The manufacturing method of a semiconductor device according to claim 1, wherein the plurality of thin film integrated circuits includes an antenna.

4. The manufacturing method of a semiconductor device according to claim 1, wherein the plurality of thin film integrated circuits includes a central processing unit.

5. The manufacturing method of a semiconductor device according to claim 1, wherein the force is applied by an apparatus.

6. The manufacturing method of a semiconductor device according to claim 1, wherein the substrate is pressed by the nozzle when applying the force to the layer to be peeled.

7. The manufacturing method of a semiconductor device according to claim 6, wherein the nozzle blows the etching gas and fastens the substrate so that the substrate does not move in accordance with the layer to be peeled.

8. The manufacturing method of a semiconductor device according to claim 6, wherein the nozzle blows the etching gas and fastens the substrate so that the substrate does not move in accordance with the layer to be peeled when the layer to be peeled is pulled.

9. The manufacturing method of a semiconductor device according to claim 1, wherein the layer to be peeled is pulled by a chuck portion coupled to an elevator mechanism while supplying the etching gas.

10. A manufacturing method of a semiconductor device, comprising:
    forming a peeling layer over a substrate having an insulating surface;
    forming a layer to be peeled including a plurality of thin film integrated circuits over the peeling layer;
    forming an opening portion in a portion of the layer to be peeled; and
    peeling the layer to be peeled having the opening portion provided over the peeling layer from the substrate by applying a force to the layer to be peeled in an atmosphere of an etching gas that generates a chemical reaction with the peeling layer,
    wherein a nozzle is used to blow the etching gas to the peeling layer and the peeling layer is exposed to the atmosphere of the etching gas prior to blowing the etching gas by the nozzle.

11. The manufacturing method of a semiconductor device according to claim 10, wherein the peeling layer is a single layer formed of an element selected from Si, W, Ti, Ta, Mo, Cr, Nd, Fe, Ni, Co, Zr, Zn, Ru, Rh, Pd, Os, or Ir, or an alloy material or a compound material containing the element as its main component.

12. The manufacturing method of a semiconductor device according to claim 10, wherein the opening portion is formed by etching or laser ablation.

13. The manufacturing method of a semiconductor device according to claim 10, wherein the plurality of thin film integrated circuits includes an antenna.

14. The manufacturing method of a semiconductor device according to claim 10, wherein the plurality of thin film integrated circuits includes a central processing unit.

15. The manufacturing method of a semiconductor device according to claim 10, wherein the force is applied by an apparatus.

16. The manufacturing method of a semiconductor device according to claim 10, wherein the substrate is pressed by the nozzle when applying the force to the layer to be peeled.

17. The manufacturing method of a semiconductor device according to claim 16, wherein the nozzle blows the etching gas and fastens the substrate so that the substrate does not move in accordance with the layer to be peeled.

18. The manufacturing method of a semiconductor device according to claim 16, wherein the nozzle blows the etching gas and fastens the substrate so that the substrate does not move in accordance with the layer to be peeled when the layer to be peeled is pulled.

19. The manufacturing method of a semiconductor device according to claim 10, wherein the layer to be peeled is pulled by a chuck portion coupled to an elevator mechanism while supplying the etching gas.

20. A manufacturing method of a semiconductor device, comprising:
    forming a peeling layer over a substrate having an insulating surface;
    forming a layer to be peeled including a plurality of thin film integrated circuits including a thin film transistor over the peeling layer; and
    peeling the layer to be peeled provided over the peeling layer from the substrate by applying a force to the layer to be peeled in an atmosphere of an etching gas that generates a chemical reaction with the peeling layer,
    wherein a nozzle is used to blow the etching gas to the peeling layer and the peeling layer is exposed to the atmosphere of the etching gas prior to blowing the etching gas by the nozzle.

21. The manufacturing method of a semiconductor device according to claim 20, wherein the peeling layer is a single layer formed of an element selected from Si, W, Ti, Ta, Mo, Cr, Nd, Fe, Ni, Co, Zr, Zn, Ru, Rh, Pd, Os, or Ir, or an alloy material or a compound material containing the element as its main component.

22. The manufacturing method of a semiconductor device according to claim 20, wherein the plurality of thin film integrated circuits includes an antenna.

23. The manufacturing method of a semiconductor device according to claim 20, wherein the plurality of thin film integrated circuits includes a central processing unit.

24. The manufacturing method of a semiconductor device according to claim 20, wherein the force is applied by an apparatus.

25. The manufacturing method of a semiconductor device according to claim 20, wherein the substrate is pressed by a nozzle when applying the force to the layer to be peeled.

26. The manufacturing method of a semiconductor device according to claim 25, wherein the nozzle blows the etching gas and fastens the substrate so that the substrate does not move in accordance with the layer to be peeled.

27. The manufacturing method of a semiconductor device according to claim 25, wherein the nozzle blows the etching gas and fastens the substrate so that the substrate does not move in accordance with the layer to be peeled when the layer to be peeled is pulled.

28. The manufacturing method of a semiconductor device according to claim 20, wherein the layer to be peeled is pulled by a chuck portion coupled to an elevator mechanism while supplying the etching gas.

* * * * *